(12) United States Patent
Scannell

(10) Patent No.: US 6,845,912 B2
(45) Date of Patent: Jan. 25, 2005

(54) BAR CODE FOR MEASURING DISTANCE AND POSITION

(76) Inventor: Thomas Whittier Scannell, 69557 Camp Polk Rd., Sisters, OR (US) 97759

(\*) Notice: Subject to any disclaimer, the term of this patent is extended or adjusted under 35 U.S.C. 154(b) by 319 days.

(21) Appl. No.: 10/318,919

(22) Filed: Dec. 12, 2002

(65) Prior Publication Data

US 2004/0111911 A1 Jun. 17, 2004

(51) Int. Cl.⁷ ................................................ G06K 7/10
(52) U.S. Cl. ......................... 235/462.01; 235/462.04; 235/462.08; 235/462.16; 235/462.02
(58) Field of Search ..................... 235/462.01, 462.02, 235/462.04, 462.07, 462.08, 462.16, 494

(56) References Cited

U.S. PATENT DOCUMENTS

| | | | | |
|---|---|---|---|---|
| 4,143,267 A | | 3/1979 | Johnson et al. | |
| 4,682,793 A | \* | 7/1987 | Walz | 462/2 |
| 4,794,239 A | \* | 12/1988 | Allais | 235/462.1 |
| 4,888,721 A | \* | 12/1989 | Kondoh et al. | 708/490 |
| 4,896,280 A | | 1/1990 | Phillips | |
| 4,901,073 A | | 2/1990 | Kibrick | |
| 5,027,526 A | | 7/1991 | Crane | |
| 5,142,793 A | | 9/1992 | Crane | |
| 5,262,625 A | \* | 11/1993 | Tom et al. | 235/462.07 |
| 5,872,730 A | \* | 2/1999 | Shevach et al. | 708/530 |
| 6,327,791 B1 | | 12/2001 | Norcross et al. | |
| 6,435,315 B1 | | 8/2002 | Zaharia | |

\* cited by examiner

*Primary Examiner*—Steven S. Paik
(74) *Attorney, Agent, or Firm*—Glenn C. Brown

(57) ABSTRACT

A numeric code has 10 characters in its set, each character having two dark bars in nine modules or a "Two of Nine Code". All bars or gaps of this code are a minimum of two modules in width. Each numeric digit may have and OCR digit embedded into the barcode digit to make it human and machine readable.

6 Claims, 3 Drawing Sheets

BAR CODE FOR MEASURING DISTANCE AND POSITION

BACKGROUND OF INVENTION

This invention relates to bar codes of the type commonly used for inventory control, specifically to a bar code which measures distance to a fine delineation over a long distance.

SUMMARY OF THE INVENTION

Many bar codes and bar code/reader combinations are on record and in use. U.S. Pat. No. 4,143,267 to Johnson et al., (Mar. 6, 1979), shows a Digital Distance Measuring Instrument that has a scale with a binary code printed sideways on it. Johnson states this system can read down to 0.001 inches however any dirt or damage to the tape would cause dysfunction. Also the tape must be quite wide if any long distance is to be measured as an extra photo-transistor must be added for each digit. A 25 foot tape would require six photo-transistors and a very busy tape, with much room for error.

U.S. Pat. No. 4,896,280 to Phillips, (Jan. 23, 1990), describes an electronic tape measure, which employs an "Absolute Position Code" which allows for measurement if one part of the tape is damaged. This code does not have any system to read over a damaged or dirty area of the tape.

U.S. Pat. No. 4,901,073, Kibrick, (Feb. 13, 1990), covers a bar code distance measuring system, however it relies upon standard 3of9 and interweaved 128 bar codes. The resolution of such a system is very low, being the width of an entire character.

U.S. Pat. Nos. 5,027,526 and 5,142,793 to Stephen Crane picture a tape measure that uses an interweaved two of five bar code in combination with pulses generated from the tape storage reel. This arrangement has its drawbacks in that the measurements taken from the reel are not adjusted for the changing diameter of the rolled tape as it is unwound. Also the interweaved two of five code is spaced out every three inches, so the tape must be moved to obtain a reading. This means no static reading can be taken with this measurement system and the combination system is not able to make "non-contact" measurement. Also this system is limited to 400 feet of measurement.

U.S. Pat. No. 5,270,522 to Bone, Jr., (Dec. 14, 1993) describes a dynamic barcode label system that is intended for electric meter reading. The hardware would have a LED type screen, which would display a bar code that would reflect the meter reading. A handheld reader would scan the electronic bar code so as to automate the reading process. U.S. Pat. No. 6,327,791 Norcross, et al., (Dec. 11, 2001) deal directly with bar codes for measuring distance, however the coding systems described are binary configurations and chain codes which are limited in length and require a look-up table for decoding.

U.S. Pat. No. 6,435,315 Zaharia (Aug. 20, 2002) discusses an absolute position reference system for an elevator. The system employs a camera and optical character recognition to locate an elevation and counts pixels from a graphics file to identify an absolute location. No bar codes are used.

OBJECTS AND ADVANTAGES

Accordingly the objects and advantages of my Bar Code for measuring distance and position are:

(a) To provide an automatic measuring system which will read highly accurate distance and position measurement.

(b) To provide an automatic measuring system which will measure distance or position up to seven decimal places.

(c) To provide an automatic measuring system which will read a distance or position with a static shot that does not require indexing to the zero or start point.

(d) To provide an automatic measuring system which will read a distance or position with multiple readings to insure data accuracy.

(e) To provide an automatic measuring system which will read a distance or position with multiple readings to read over a damaged or dirty code area.

(f) To provide an automatic measuring system which will read a distance or position using common bar code reading devices on the market today.

(g) To provide a automatic measuring system which will read a distance or position using Optical Character Recognition (OCR) to read digits embedded into the barcode.

Further objects and advantages are to provide an accurate measuring system, which can be converted to metric or engineering delineations and can be read from a bar code with line width and spacing that would be considered wide by industry standards and thus reliable and inexpensive to print.

BRIEF DESCRIPTION OF THE DRAWINGS

In the drawing figures, closely related figures have the same number but different alphabetic suffixes.

REFERENCE NUMERALS IN DRAWINGS

Figure 1:
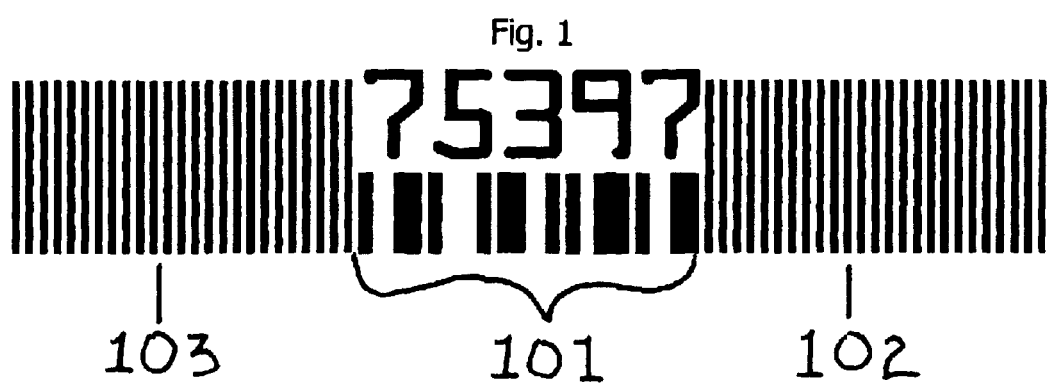
FIG. 1 shows a bar code unit having a value of 7,539,700 and 50 subtractive delineations and 50 additive delineations.
Figure 2:
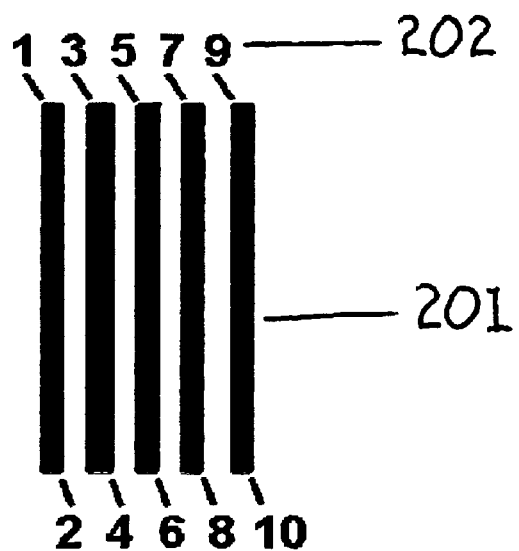
FIG. 2 pictures additive or subtractive delineation units and their numbered points of measurement.
Figure 3:
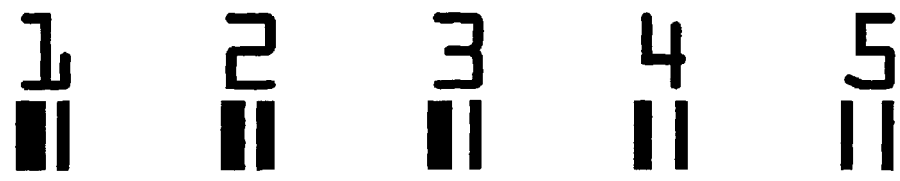
FIG. 3 displays numeric bar code/OCR digits for marking the reference numeral blocks.
Figure 3:
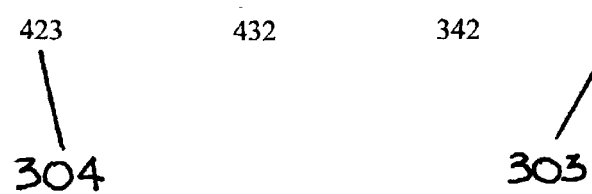
Figure 4:
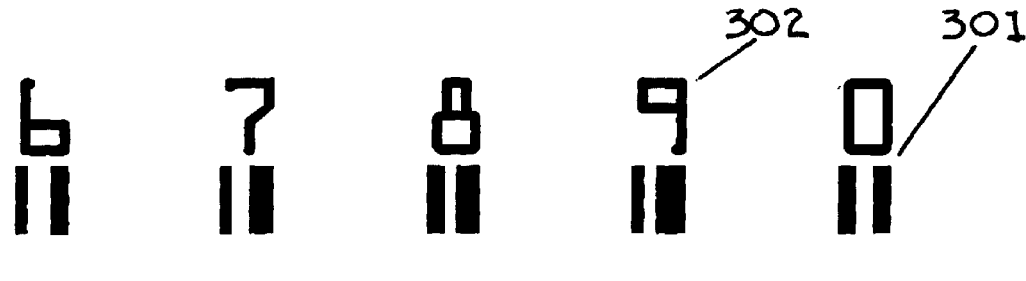
FIG. 4 shows a portion of distance measuring bar code.
Figure 4:
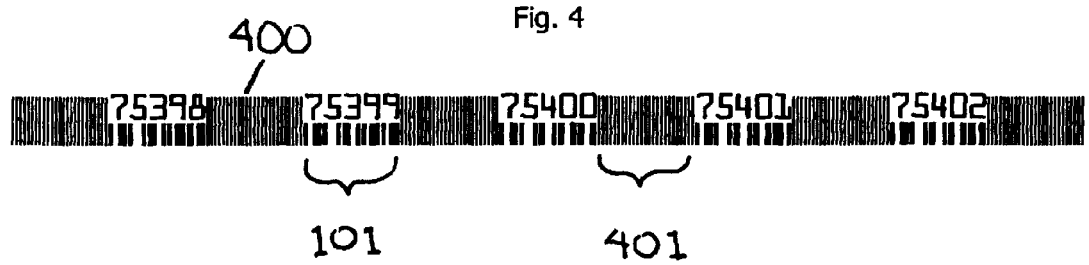

FIG. 1
101 Numeric Value Block
102 Credit Bar Block
103 Debit Bar Block
FIG. 2
201 Credit/Debit Bar Edge
202 Credit/Debit Bar Edge Count Value
FIG. 3
301 Code 2of9OCR Digit
302 Value of Code 2of9OCR Digit embedded as an OCR readable character
303 Minimum Width Bar of Code 2of9OCR Digit
304 Bar Width indicators for Code 2of9OCR Digit
FIG. 4
101 Numeric Value Block
400 Linear Measuring Bar Code
401 Credit/Debit Bar Block
FIGS. 5A to 5G
501 Measurement Audit Window
502 Partial or incomplete Numeric Value Block (101)

DETAILED DESCRIPTION OF THE PREFERRED EMBODIMENT

A simple embodiment of the present invention is shown in FIG. 1. Reference numeral 101 shows a block of five Code 2of9OCR Digits 301, being a Numeric Value Block. This Numeric Value Block is the index point of the linear distance measuring system. In FIG. 1, the value of Numeric Value Block 101 is 7,539,700X.

Reference Numeral 102 pictures Credit Bars in a Credit Bar Block and 103 depicts Debit Bars in a Debit Bar Block.

In the preferred embodiment, the Credit and Debit Bar blocks would have 25 dark bars and 25 light spaces of the same width, for a total block width of 50X.

Numeric Value Block 101 would have five digits, each being 10X in width, for a total width of 50X.

FIG. 2 shows Credit or Debit bars 201 of 1X in width and cumulative numeric values 202 for distance determination. The bar code reader would identify the individual, dark Credit/Debit Bars 201 at the edges and add up the total number of edges and assign a value 202.

FIG. 3 shows 10 digits of this numeric bar code system. Reference numeral 301 illustrates the 2of9OCR digit zero, the value of which is shown by an embedded OCR readable digit 302. Each digit is 9X modules wide and has two dark bars and one light space. The minimum width for the bars and spaces is 2X, as shown by 303, with combinations of 2X, 3X, 4X and 5X being used for the code, as shown in 304. The code is a discrete, numeric, multi-width symbology having 10 characters in its set. It would be considered a (9,2) code, having two bars in nine modules or a "Two of Nine Code". In this embodiment Code 2of9OCR would have an Inter-character Gap, 1X in width on the right side, giving each digit a full working width of 10X. The 5 and 0 digits are unique with the other digits being paired opposites.

The pairs are; 4 & 6, 3 & 7, 2 & 8, and 1 & 9.

In the preferred embodiment, an OCR-A (Optical Character Recognition type A) digit is embedded in the numeric digits to make it human and computer readable.

FIG. 4 displays a sequential pattern of Numeric Value Blocks and Credit/Debit Blocks 401 in a horizontal orientation, comprising a Linear Measuring Bar Code 400.

Figure 5A:
FIG. 5A shows a horizontal portion of distance measuring bar code.

FIG. 5A displays a sequential pattern of Numeric Value Blocks 101 and Credit/Debit Blocks 401 in a horizontal orientation, comprising a Linear Measuring Bar Code 400. FIGS. 5B to 5G display individual Audit Windows 501 as the bar code reader would see and read them.

Operation

In the preferred embodiment of the present invention, Linear Measuring Bar Code 400 is made up of Numeric Value Blocks 101 and Credit/Debit Blocks 401. Each of these blocks is 50X in width. The bar code Reader (not Shown) used to read this bar code 400 would read a distance of 150X, as shown in FIG. 1. Portions of the Linear Measuring Bar Code 400 outside the Audit Windows 501 would be masked from the view of the bar code reader. The bar code reader would view the Linear Measuring Bar Code 400 through a window 150X wide that was stationary in respect to the barcode reader.

In FIG. 1, the reader would find a value from five 2of9OCR Code digits 301 to be 7,539,700X. The Reader and associated hardware would count the edges 202 of the Debit Bars 103 and find a value of 50X. The reader would at the same time count the edges 202 of the Credit Bars 102 and find a value of 50X. The 50X Debits would be subtracted and the 50X credits would be added to come up with an Audit Value of 7,539,700X.

Figure 5B:
FIGS. 5B to 5G reveal individual Audits of the bar code as it would be read.

FIG. 5B illustrates such a scenario as the Numeric Value Block 101 of Full Width Audit 501 has a value of 7,539,900X. The Audit is in a position where the Credit Bars 102 and Debit Bars 103 are both reading 50X and thus do not modify the value of Numeric Value Block 101 from 7,539,900X.

Figure 5C:
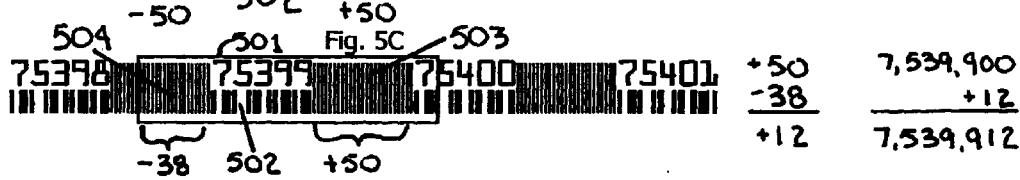

In FIG. 5C the Audit has moved to the right so that only 38X Debit Bars 103 are read. All 50X Credit Bars 102 are read, so the value of the Audit is; 7,539,900X (minus 38X) (plus 50X)=7,539,900X (plus 12X)=7,539,912X. The Reader does not recognize less than five full digits, so the partial Numeric Value Block 502 is ignored.

Figure 5D:

The 2of9OCR code is designed so that all bars used to identify digits are a minimum of 2X in width. This allows the bar code reader and decoder to easily measure the end of a Numeric Value Block and the start of a Credit/Debit Bar Block. In FIG. 5D, 4X Debit Bars 103 and 50X Credit Bars 102 are read to give the Audit a value of 7,539,900X (minus 4X) (plus 50X)=7,539,900X (plus 46X)=7,539,946X.

Figure 5E:
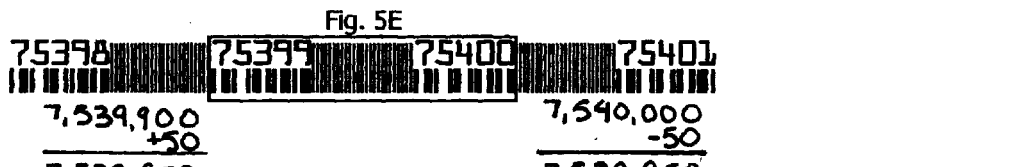

FIG. 5E presents a situation where two Numeric Value Blocks are read and one 20 Credit/Debit block is read. This central Credit/Debit bar Block 401 is now used as a Credit Bar Block 102 to the Numeric Value Block 101 on the left with a value of 7,539,900X and is also used as a Debit Bar Block 103 to the Numeric Value Block 101 on the right with a value of 7,540,000X. The value of this Audit is 7,539,900X (plus 50X)=7,539,950X and/or 7,540,000 (minus 50X)=7,539,950X.

Figure 5F:
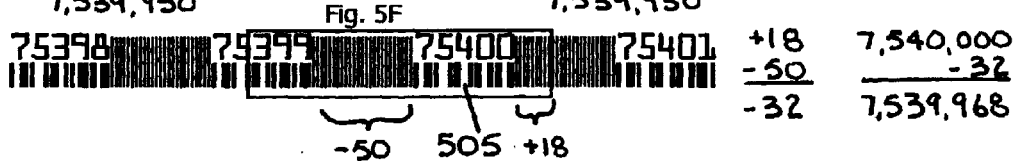

In FIG. 5F, Numeric Value Block 101 is the index point with 50X units in a Debit Bar Block 103 and 18x units used as the Credit Bar Block 102. The audit Value is 7,540,000X (minus 50X) (plus 18X)=7,540,000X (minus 32X)=7,539,968X.

Figure 5G:
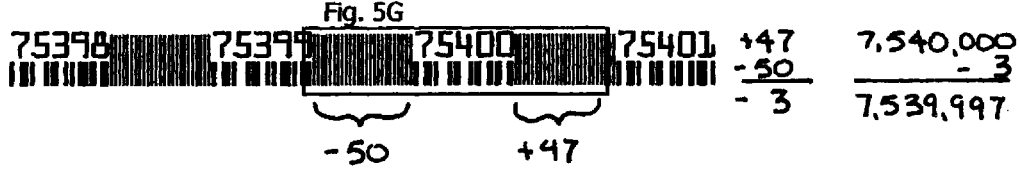

FIG. 5G has an Audit value of 7,540,000X (minus 50X) (plus 47X)=7,540,000X (minus 3X)=7,539,997X.

With modern bar code reading equipment, a bar code printed with a X value of 12 mils (1/1000th of a foot) would be able to be measured down to a distance of about 5 mils. If the value of X is 1/1000th of a foot (12 mills) then the bar code's capacity of 9,999,999X would be equal to about 10,000 feet.

Further, State of the art bar code reading equipment will be able to read and recognize the OCR characters 302 embedded into the 2of9OCR digits 302 and validate the decoding of the bar code widths into numeric representation. This redundancy will increase the accuracy of the total system to a very high level of certainty.

Summary, Ramification, and Scope

Accordingly, a person will see that the bar code of this invention can instantly measure a linear distance or position on a ribbon 10,000 feet in length with a accuracy greater than 5 mils. In addition, this bar code, when used with modern Optical Character Recognition software, will have a validation system that will insure accurate measurement.

Furthermore, the bar code of my invention has the additional advantages in that:

It has wide X values, giving it high reliability;

It has a numeric 2of9OCR code with minimum bar width of 2X to give highly accurate digit identification.

Although the description above contains many specifications, these should not be construed as limiting the scope of the invention but merely as providing illustrations of some of the presently preferred embodiments of this invention. r example, an interleaved 2 of 5 code might be used to replace the 2of9OCR code. e total Audit could cover a wider section of the code tape making two, three or even four separate audits, etc.

A surveying grade rod could be set up to read a length measuring bar-code and detect a flat plane laser commonly used in surveying. An electronic means of recoding the difference between a known elevation and said laser plane could be stored in memory by manual activation of a button. Said electronic device would then be able to calculate the elevation of said laser beam. Said electronic means could then calculate the elevation of a different point by comparing the difference between the unknown point and the known elevation of said laser beam.

Machine automation devices employ expensive mechanical devices to index "X", "Y", "X" and rotational locations. These devices become very expensive at large distances. Said Bar-Code for Measuring Distance and Position with a bar-code reader could be employed to index the location of a multitude of devices over distances up to 10,000 feet. These include Robots, steel cutting pantographs, overhead gantry cranes, automated warehouse applications and manufacturing assembly lines.

In as much as said Bar-Code for Measuring Distance and Position could be printed on a curved surface, the rotational position of devices such as sun tracking solar panels, satellite receivers and telescope observatory domes could be monitored and controlled.

A large version of said Bar-Code for Measuring Distance and Position could be painted on to airport runways to assist computerized automatic pilot and safety systems.

Videotapes and data storage tapes could be printed with said Bar-Code for Measuring Distance and Position which would allow instant location indexing of data and increased data storage by removing the electronic indexing presently used.

Products that are sold in rolls, such as tubing, wire, could be printed with said Bar-Code for Measuring Distance and Position. The box these items are stored in could have a window that is the proper width and the length of material rolled off the real could be measured at the beginning and end to determine the length of the product that was removed.

An Internet enabled bar-code reader could be set up to read said Bar-Code for Measuring Distance and Position. Said reader could be mounted in a wide variety of structures and infrastructure devices for monitoring. Bridges and buildings could be monitored for settling, flexing or earthquake movement. Water tanks and dams could be wired to measure the height/volume. The position gates and valves on dams could be monitored and controlled. Rivers and effluent conduits could be monitored for flow. Uses for said Bar-Code for Measuring Distance and Position are limited only by the imagination of the user.

Thus, the scope of the invention should be determined by the appended claims and their legal equivalents, rather than by the examples given.

What is claimed is:

1. A 2 of 9 bar code system for representing 10 characters, each character comprising:

a set of barcode digits comprising two bars and one space;

the total width of the bars and spaces being 9×; and each bar and space having a width that is at least 2× and no greater than 5×.

2. A bar code system according to claim 1 where the 2 of 9 bar code system represents numbers having one or more digits.

3. A bar code system according to claim 2 where each of the one or more digits is separated from an adjacent digit by a space at least 1× wide.

4. A bar code system according to claim 1 where a machine readable character is associated with each character represented by the bar code system.

5. A bar code system according to claim 4 where the machine readable characters are read by optical character recognition software.

6. A bar code system according to claim 1 where the bars are magnetic media.

* * * * *